United States Patent [19]
Murakami et al.

[11] Patent Number: 5,109,198
[45] Date of Patent: Apr. 28, 1992

[54] NUCLEAR MAGNETIC RESONANCE IMAGING APPARATUS

[75] Inventors: Yoshiki Murakami, Nerima; Etsuji Yamamoto, Akishima; Masao Yabusaki, Katsuta; Hideki Kohno, Tama; Munetaka Tsuda, Mito; Toshihiro Ishizuka, Katsuta, all of Japan

[73] Assignee: Hitachi, Ltd., Tokyo, Japan

[21] Appl. No.: 469,916

[22] Filed: Jan. 24, 1990

[30] Foreign Application Priority Data

Jan. 25, 1989 [JP] Japan .................................. 1-13906
Dec. 22, 1989 [JP] Japan .................................. 1-331308

[51] Int. Cl.⁵ .................................................. G01R 33/20
[52] U.S. Cl. .................................................. 324/318
[58] Field of Search ............... 324/307, 309, 318, 322; 128/653 SC; 333/219

[56] References Cited

U.S. PATENT DOCUMENTS

| | | | |
|---|---|---|---|
| 4,720,680 | 1/1988 | Nishihara et al. | 324/322 |
| 4,825,163 | 4/1989 | Yabusaki et al. | 324/322 |
| 4,833,429 | 5/1989 | Keren et al. | 324/322 |

OTHER PUBLICATIONS

Kumar et al, "NMR Fourier Zeugmatography", J. Magnetic Resonance, vol. 18, pp. 69-83, 1975.
Edelstein et al, "Spin Warp NMR...", Physics in Medicine & Biology, vol. 25, pp. 751-756, 1980.
Alderman et al, "An Efficient Decoupler Coil Design...", J. of Magnetic Resonance, vol. 36, pp. 447-461, 1979.
Sank et al., "A Quadrature Coil...", J. of Magnetic Resonance, vol. 69, pp. 236-242, 1986.

Primary Examiner—Michael J. Tokar
Attorney, Agent, or Firm—Antonelli, Terry, Stout & Kraus

[57] ABSTRACT

In a nuclear magnetic resonance imaging apparatus including a first probe circuit for detecting magnetic flux in a first direction and a second probe circuit for detecting magnetic flux in a direction perpendicular to the first direction, the arm angle of conductor arms to form the first probe circuit and the arm angle of conductor arms to form the second probe circuit are different from each other.

14 Claims, 13 Drawing Sheets

NUCLEAR MAGNETIC RESONANCE IMAGING APPARATUS

BACKGROUND OF THE INVENTION

The present invention relates to a nuclear magnetic resonance imaging apparatus to measure a nuclear magnetic resonance (hereinafter abbreviated as "NMR") signal from hydrogen, phosphorus and the like in a human body and to image the density distribution of nuclei, distribution of relaxation time, and the like.

In the prior art, an X-ray CT and an ultrasonic imaging apparatus are widely used as an apparatus for the nondestructive inspection of an internal structure such as of a human brain and abdomen. In recent years, a trial of performing a similar inspection using an NMR phenomenon has been attempted whereby many sorts of information can be obtained which are not obtained by an X-ray CT or an ultrasonic imaging apparatus.

In an imaging apparatus using an NMR phenomenon, a signal from an inspection substance must be separated and discriminated corresponding to the position. As one such method, intensity of a static magnetic field is provided with inclination along an arbitrary direction thereby the magnetic field intensity in each position is made different hence a resonant frequency or a phase encoding value in each position is made different so as to obtain information of the position. The basic principle of this method is reported in "Journal of Magnetic Resonance", vol. 18, pp 69–83 (1975), "Physics in Medicine & Biology", vol. 25, pp 751–756 (1980) or the like.

Since SN (signal-to-noise) ratio in the NMR increases in proportion to the power of 1-1.5 of the static magnetic field H, the magnetic field intensity is being made as high as possible so as to improve the SN ratio. A transmitting and receiving probe (hereinafter referred to simply as "probe") which has been used until now is a solenoid or a saddle shape probe, and since its resonant frequency increases as the magnetic field intensity increases, the self resonant frequency of the probe and the NMR frequency may come close to each other or relation of both may be reversed. As a result, a problem of lowering of sensitivity in the receiving state or lowering of the generating efficiency of the high-frequency magnetic field in the transmitting state will be produced.

On the contrary, a probe of new type by Alderman et al. (called "the Alderman type probe") has been proposed. The basic principle of this probe is described in "Journal of Magnetic Resonance", vol. 36, pp 447–451 (1979).

In the imaging as above described, improvement of the efficiency of the probe for generating or receiving the high-frequency magnetic field becomes the important problem leading to improvement of the picture quality and decrease of the image pick-up time. One method of constituting a quadrature-phase detection probe (hereinafter abbreviated as a "QD probe") has been proposed by D. I. Holt et al. This probe theoretically improves the SN ratio $\sqrt{2}$ times in comparison to the Alderman type probe. The basic principle of this method is described in "Journal of Magnetic Resonance", vol. 69, pp 236–242 (1986).

FIGS. 28, 29 and 30 show the QD probe, and FIG. 28 is a bird's eye view of the probe, FIGS. 29(a)(b)(c) are sectional views taken in lines A'—A', B'—B', C'—C' of FIG. 28, and FIG. 30 is a sectional view in the xz plane of FIG. 28, respectively. The QD probe is provided with a first arm pair comprising two conductor arms 3a and 3c in direction coincident with the direction (z-axis direction) of the static magnetic field and a second arm pair comprising two conductor arms 3b and 3d also in the z-axis direction, and wings 4a–4d extended laterally from each one end of the respective conductor arms are connected by capacitors 24a–24d and wings 4e–4h extended laterally from other end of the respective conductor arms are connected by capacitors 24e–24h. Further guard rings 1a, 1b are arranged in the vicinity of two sets of the wings respectively. The QD probe is combination of a first probe circuit having a port A as a feeding point and the first pair of arms as a current path and a second probe circuit having a port B as a feeding point and the second pair of arms as a current path, and a matching circuit composed of capacitors 24q, 24r shown in FIG. 31 is connected to the ports A, B respectively. The matching circuit is further connected through a cable ring shown in FIG. 32 to a transmitter and a receiver of the NMR apparatus, thus transmitting signals of high frequency are supplied to both ports in the phase difference of 90 degrees, and receiving signals of high frequency from both ports having the phase difference of 90 degrees are combined in the same phase and guided to the receiver.

SUMMARY OF THE INVENTION

The QD probe in the prior art is effective only in a circular portion such as brain, but consideration is not taken regarding a problem occurring where an elliptic portion such as abdomen is an object to be inspected. This problem will be described referring to FIGS. 29(a), (b) and (c). The QD probe previously described is usually installed in direction of detecting the magnetic field of the two directions, i.e., the horizontal and vertical directions.

That is, the arms 3a, 3c are opposed in the vertical direction thereby the probe circuit viewing from the port A having the two arms as a current path has sensitivity to the magnetic flux in the horizontal direction. Also the probe circuit viewing from the port B having the arms 3b, 3d as a current path has sensitivity to the magnetic flux in the vertical direction. An object to be inspected is inserted in the probe usually on its back. Consequently, when the image pick-up of the abdomen is performed, the cross-section shape of the object 20 to be inspected at the probe position becomes elliptic form as shown in FIGS. 29(a), (b) and (c). In this state, a load applied to the pair of arms 3b, 3d becomes larger than that applied to the pair of arms 3a, 3c, thereby amount of the receiving signal obtained from the port B becomes about 0.5 times of that obtained from the port A. Even if both signals being different in the signal amount as above described are added in the same phase, the SN ratio cannot be improved as was expected. Further, the sensitivity distribution within the visual field becomes not uniform, and the density of the image becomes low at portion near the arms 3b and 3d, i.e., near both ends of the x-axis.

An object of the invention is to provide a nuclear magnetic resonance imaging apparatus wherein the high-frequency signal receiving with the high SN ratio is possible even in an object to be inspected having cross-section of elliptic shape rather than circular shape, such as a human abdomen.

Another object of the invention is to provide a nuclear magnetic resonance imaging apparatus wherein the sensitivity distribution within the visual field is uniform.

Still another object of the invention is to provide a nuclear magnetic resonance imaging apparatus wherein the resonant frequency of each of the probes constituted by the two pairs of arms respectively can be easily adjusted.

The basic features to attain the foregoing objects is in that among the two pairs of arms to constitute an RF (radio frequency) probe, an angle of the arm (angle from the center of the probe covering the width of each conductor arm) of the first pair of arms is made different from that of the second pair of arms. More specifically, assuming that an object to be inspected having width in the lateral direction larger than thickness in the vertical direction is inserted, the angle of the arm of the pair of arms opposed in the vertical direction is made larger than that of the pair of arms opposed in the horizontal direction.

Further one of specific features to avoid the problem that difference of the resonant frequency is produced between the two probe circuits when the basic characteristic constitution is taken, is in that the top ends of wings extended laterally from both ends of the respective conductor arms of the first pair of arms are coupled with each other in the capacitive coupling, and that the top ends of wings extended laterally from both ends of the respective conductor arms of the second pair of arms are coupled with each other in the capacitive coupling separately from the wings of the first pair of arms. Typical example of this constitution is in the structure that one of the two sets of Alderman type probes being different in diameter is arranged to the inside of the other and combined so that the sensitivity directions of the probes are perpendicular to each other, i.e., the directions of lines to connect the pair of arms are perpendicular to each other. This structure is clearly distinguished from the QD probe in the prior art where the wings extended laterally from both ends of the four conductor arms respectively are coupled in the capacitive coupling in sequence in ring shape.

Another specific feature to avoid occurrence of the difference of the resonant frequency as above described is in that each conductor arm of the two pairs of arms is constituted by a plurality of conducting rods, and among the pairs of arms, a gap of each conducting rod of the first pair of arms is made different from that of each conducting rod of the second pair of arms, thus the first pair of arms and the second pair of arms are different from each other in the angle of arm.

Other features of the invention will be made clear by the description of embodiments.

In the RF probe using a plurality of arms having some width, the current distribution within each conductor arm is concentrated to the end in the width direction. Consequently, if the angle of the arm is varied per each pair of arms, that is, if an object to be inspected with elliptic shape is inserted thereby the angle of the arm is narrowed in the pair of arms exhibiting the lowering of the sensitivity and the angle of the arm is widened in the pair of arms opposed perpendicular to the previous pair of arms, non-uniformity of the sensitivity distribution is compensated, and further since the difference of the load in both pairs of arms is decreased, the SN ratio is also improved.

Further, if the angle of the arm is different, in general, difference occurs in the inductance of the arm. Therefore if such constitution is taken that the top ends of the wings extended from respective conductor arms of the first pair of arms are coupled with each other in the capacitive coupling, and the top ends of the wings of the second pair of arms are coupled with each other in the capacitive coupling independently of the first pair of arms, individual coupling capacitance is adjusted separately and the resonant frequency of the first and second probes can be made coincident easily. On the other hand, when each conductor arm is constituted by a plurality of conducting rods and the difference is provided in the angle of the arm due to the difference of the gap of the conducting rods, since the difference of the inductance per each arm is little, the QD probe to facilitate the coincidence of the resonant frequency can be obtained also in this constitution.

According to the invention, various problems produced when the nuclear magnetic resonance imaging apparatus using the quadrature-phase detection probe measures an object to be inspected having non-circular cross-section, that is, the sensitivity difference of the two pairs of arms, lowering of the SN ratio produced due to shift from 90 degrees of the signal phase, and the sensitivity unevenness within the visual field due to the sensitivity difference are eliminated, and the image with the high SN ratio and the high uniformity can be obtained.

DETAILED DESCRIPTION OF EMBODIMENTS

Figure 1:
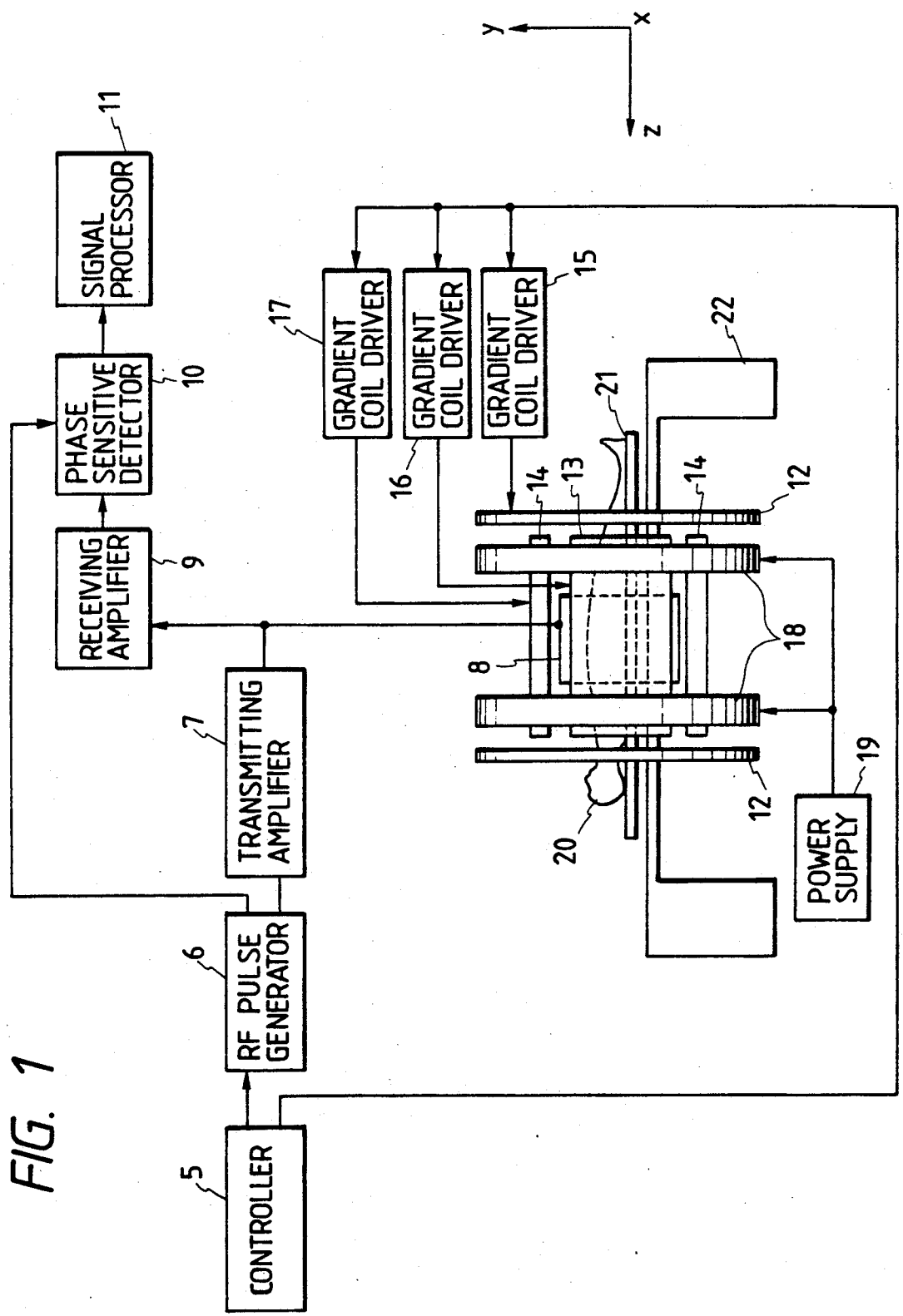
FIG. 1 is a block diagram showing the whole body of an NMR imaging apparatus as an embodiment of the invention.

FIG. 1 is a constitution diagram of an imaging apparatus using NMR as an embodiment of the invention.

A coil 18 generates a static magnetic field of the definite intensity and the definite direction (z-axis direction) in its inside space by current supplied from a power supply 19. On the other hand, three sets of gradient coils 12, 13, 14 are driven by gradient coil drivers 15, 16, 17 respectively, and the intensity of the static magnetic field is provided with inclination along the z direction and the x direction and the y direction being perpendicular thereto, respectively. An RF (radio frequency) probe 8 formed on a cylindrical bobbin is installed to the inside of these coils. A movable bed 21 is installed on a supporter 22, and an object 20 to be inspected is held on the bed 21 and inserted in the RF probe 8. Output of an RF pulse generator 6 is amplified by a transmitting amplifier 7 and supplied to the RF probe 8, thereby the high-frequency magnetic field is generated. A controller 5 controls the driving of each gradient coil and the timing of generating the high-frequency magnetic field in accordance with programmed sequence, and therefore excites the nuclear spin of the object to be inspected. High-frequency signal by the nuclear magnetic resonance of the object to be inspected is received by the RF probe 8, and led through a receiving amplifier 9 and a phase sensitive detector 10 to a signal processor 11. The signal processor 11 processes the receiving data after sampling and converts it into image.

Figure 2:
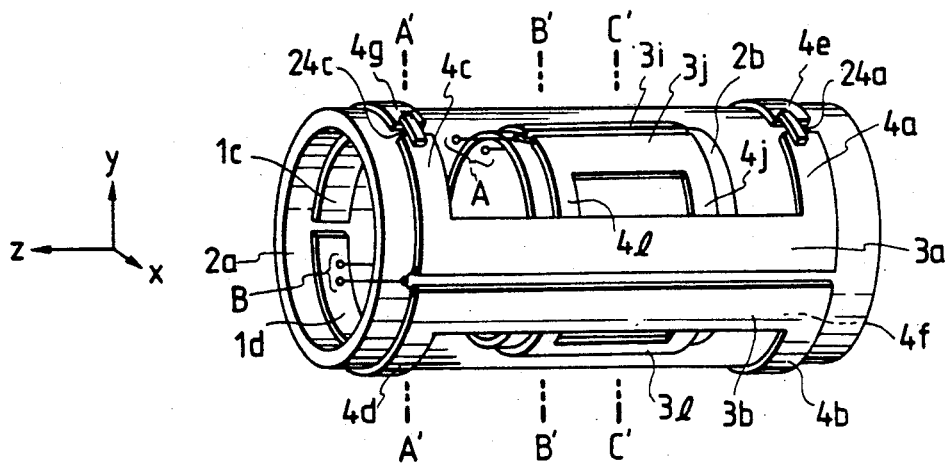
FIG. 2 is a bird's eye view showing an example of a probe used in the NMR imaging apparatus of FIG. 1.
Figure 3A:
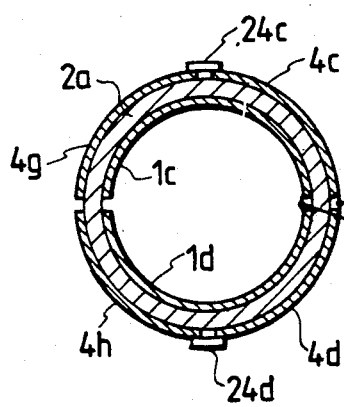
FIGS. 3(a), 3(b) and 3(c) are sectional views on lines A'—A', B'—B' and C'—C' of FIG. 2 respectively.
Figure 3B:
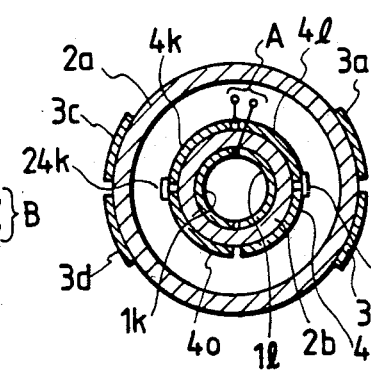
Figure 3C:
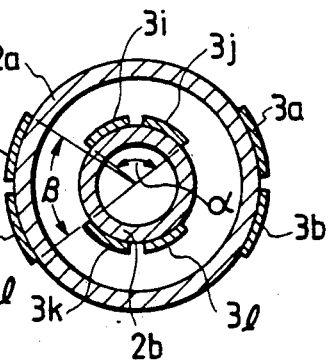
Figure 4:
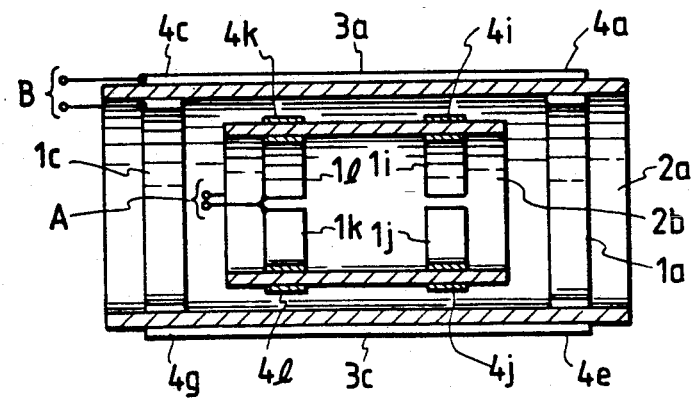
FIG. 4 is a sectional view of FIG. 2 cut along the xz plane.

FIGS. 2 through 4 show specific constitution of the RF probe 8. FIG. 2 is a bird's eye view, FIGS. 3(a), (b) and (c) are sectional views on lines A'—A', B'—B' and C'—C' of FIG. 2, and FIG. 4 is a sectional view of FIG. 2 cut along the xz plane, respectively.

The RF probe detects the high-frequency magnetic field perpendicular to the static magnetic field. Further in the embodiment, in order to constitute a quadrature-phase detecting probe, a first probe for detecting magnetic flux in the x direction and a second probe for detecting magnetic flux in the y direction are combined. The first probe includes a pair of conductor arms arranged with respect to the yz plane as symmetry plane through the center axis in the z-axis direction, and on the other hand the second probe includes a pair of conductor arms arranged with respect to the xz plane as symmetry plane passing through the center axis. The probe arranged to the outside (corresponding to the second probe) will be first described. On the outside surface of the bobbin 2a made of insulation material, conducting plates 3a, 3b along the z-axis direction are arranged side by side and constitute one conductor arm. At the symmetry position to this conductor arm with respect to the yz plane as symmetry plane, another conductor arm comprising conducting plates 3c, 3d is installed. This is shown in FIGS. 3(b) and 3(c). Conducting wings 4a, 4c are extended respectively from both ends of the conducting plate 3a, and also wings 4b, 4d are extended from the plate 3b, wings 4e, 4g are extended from the plate 3c, and wings 4f, 4h are extended from the plate 3d, respectively.

At the inside surface of the bobbin, a conductor 1a is formed at position corresponding to the wings 4a and 4e. Also a conductor 1b is formed at the inside of the wings 4b and 4f, a conductor 1c is formed at the inside of the wings 4c and 4g, and a conductor 1d is formed at the inside of the wings 4d and 4h. Among these conductors 1a–1d, the conductors 1c, 1d are shown in FIG. 3(a), and the conductors 1a, 1c are shown in FIG. 4. The wings 4a and 4e are coupled in the capacitive coupling through both the conductor 1a and a resonance adjusting capacitor 24a, and the wings 4c and 4g are coupled in the capacitive coupling through the conductor 1c and a capacitor 24c, thus a current path circulating in 3a—4a—1a—4e—3c—4g—1c—4c—3a is formed. Also at the lower half side of the bobbin, the capacitive coupling of the wings 4b and 4f and the capacitive coupling of the wings 4a and 4h are formed by capacitors 24b, 24d and the conductors 1b, 1d, thus another current path circulating in 3b—4b—1b—4f—3d—4h—1d—4d—3b is formed. Thereby high-frequency magnetic flux in the y-axis direction (vertical direction) is detected using the port B as a signal outputting point, and reversely the high-frequency signal is applied to the port B thereby the high-frequency magnetic field in the y-axis direction can be generated. The conductors 1a and 1b are called a guard ring, and may be made a ring-shaped conductor without dividing in 1a and 1b. Similar condition applies to the conductors 1c and 1d. Also the conductors 3a and 3b to constitute an arm may be integrated. Similar condition applies to the conductors 3c, 3d to constitute another arm.

Single body of such outside probe is called Alderman type probe. On the other hand, a probe formed on the inside bobbin 2b is Alderman type probe comprising similar components to that of the outside probe. In FIG.

1 and FIGS. 3(a), (b) and (c), corresponding to suffix a, b, c, d, e, f, g, h added to symbol of each part of the outside probe, suffix i, j, k, l, m, n, o, p is added to symbol of each corresponding part of the inside probe However, the inside probe is installed with respect to the outside probe in the direction rotated by 90 degrees about the center axis (z-axis) of the bobbin, thereby the high-frequency magnetic flux in the x-axis direction (horizontal direction) is detected using the port A as a signal outputting point, and the high-frequency magnetic field in the x-axis direction is generated by feeding to the port A.

Assuming that NMR signal is measured from an object to be inspected having width in the horizontal direction larger than thickness in the vertical direction, such as a human abdomen laid on its back, as shown in FIG. 3(c), the arm angle $\alpha$ of respective conductor arms of the inside probe (angle covering the probe center from both ends of the conductor arm in the width direction) is made larger than the arm angle $\beta$ of respective arms of the outside probe. Thereby the SN ratio of receiving the NMR signal is improved and nearly uniform sensitivity distribution can be attained within the visual field. The reason seems in that since the highest sensitivity within the arm is obtained in the ends viewing from the current distribution within the conductor arm, when such arm angles $\alpha$, $\beta$ are set, the high sensitivity portion as a whole is moved near the x-axis rather than near the y-axis thereby generation of the sensitivity difference between both probes is compensated.

In general, if there exists difference of the arm angle between the two pairs of arms in the perpendicular probes, difference is produced in the inductance of both. In the embodiment, the opposed pair of arms is coupled in the capacitive coupling separately from another pair of arms being perpendicular thereto, the coupling capacitance is individually adjusted thereby the resonant frequency of respective probes can be made coincident irrespective of difference of the inductance.

Figure 5:
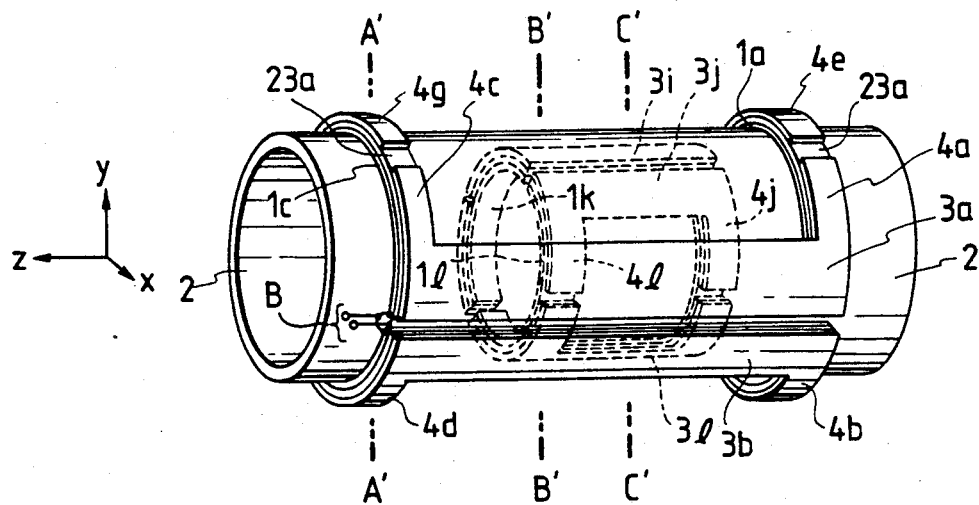
FIG. 5 is a bird's eye view showing another example of a probe used in the NMR imaging apparatus of FIG. 1.
Figure 6A:
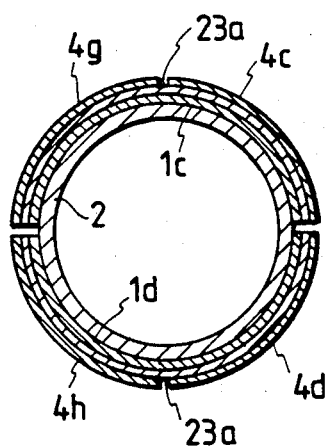
FIGS. 6(a), 6(b) and 6(c) are sectional views on lines A'—A', B'—B' and C'—C' of FIG. 5 respectively.
Figure 6B:
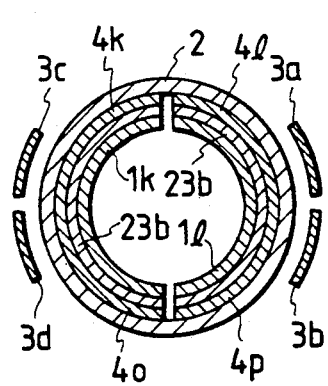
Figure 6C:
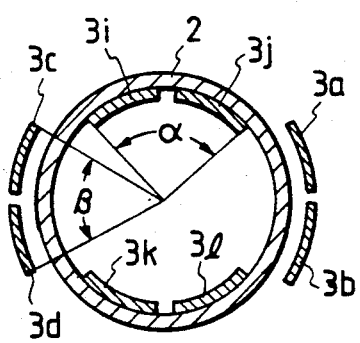
Figure 7:
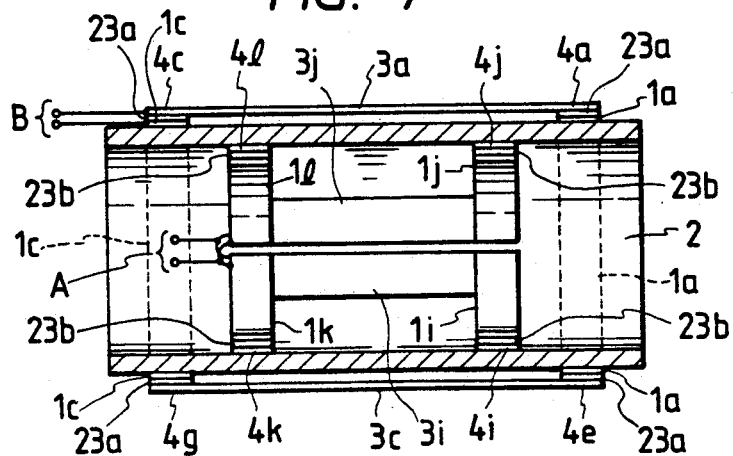
FIG. 7 is a sectional view of FIG. 5 cut along the xz plane.

Other embodiments will now be described. Capacitors connected between wings of the embodiment are not shown in drawings for avoiding complication of the drawings. FIG. 5 is a bird's eye view showing another embodiment of the invention, FIGS. 6(a), (b) and (c) are sectional views on lines A'—A', B'—B' and C'—C' of FIG. 5, and FIG. 7 is a sectional view of FIG. 5 cut along the xz plane, respectively. This embodiment is different from the embodiment of FIGS. 2 through 4 in that two Alderman type probes are formed on one bobbin 2. That is, at the outside of the bobbin 2, a first probe comprising arms 3a-3d, wings 4a-4h, an insulation layer 23a and guard rings 1a-1d is formed. Also at the inside of the bobbin 2, a second probe comprising arms 3i-3l, wings 4i-4p, an insulation layer 23b and guard rings 1i-1k is formed in the direction rotated by 90 degrees from the first probe.

Figure 8:
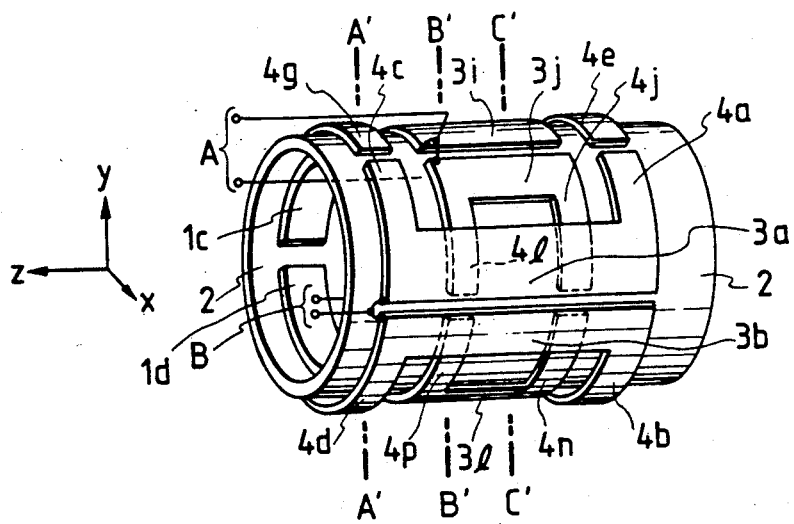
FIG. 8 is a bird's eye view showing further example of a probe used in the NMR imaging apparatus of FIG. 1.
Figure 9A:
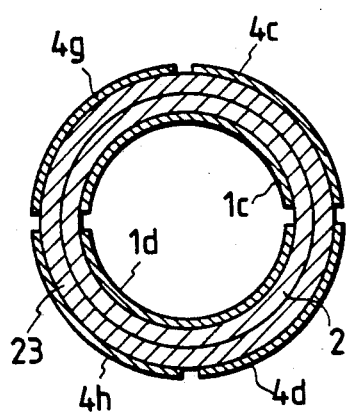
FIGS. 9(a), 9(b) and 9(c) are sectional views on lines A'—A', B'—B' and C'—C' of FIG. 8 respectively.
Figure 9B:
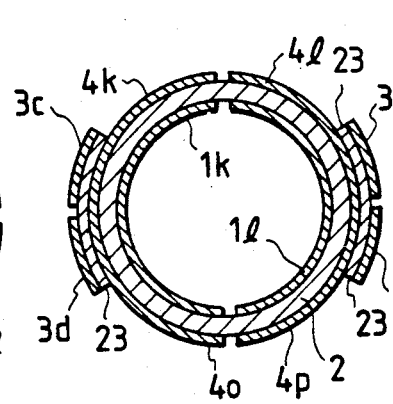
Figure 9C:
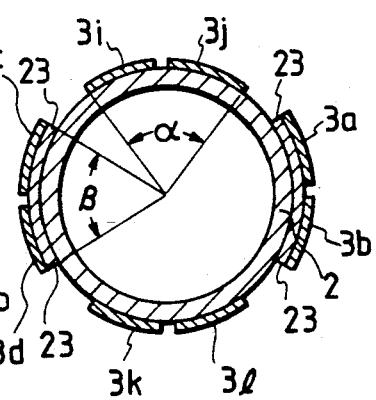
Figure 10:
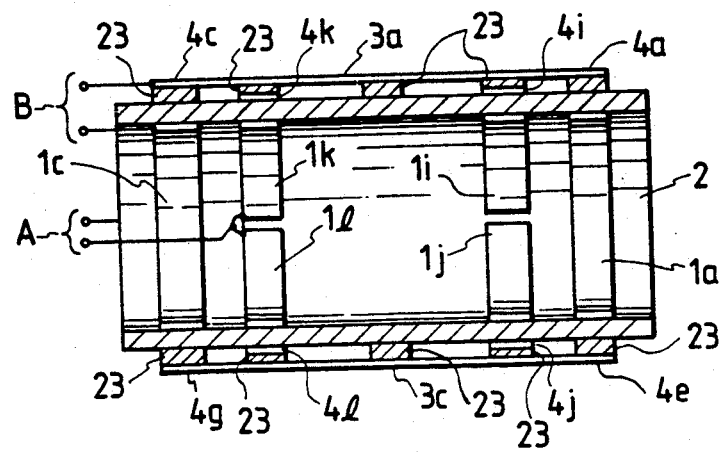
FIG. 10 is a sectional view of FIG. 8 cut along the xz plane.

FIG. 8 is a bird's eye view showing another embodiment of the invention, FIGS. 9(a), (b) and (c) are sectional views on lines A'—A', B'—B' and C'—C' of FIG. 8, and FIG. 10 is a sectional view of FIG. 8 cut along the xz plane. In this embodiment, at the outside of a bobbin 2, arms 3i-3l and wings 4i-4p extended therefrom are formed, and further thereon arms 3a-3d and wings 4a-4h extended therefrom are formed through an insulation layer 23. Guard rings 1i-1k and 1a-1d opposed to respective wings are formed at the inside of the bobbin.

Figure 11:
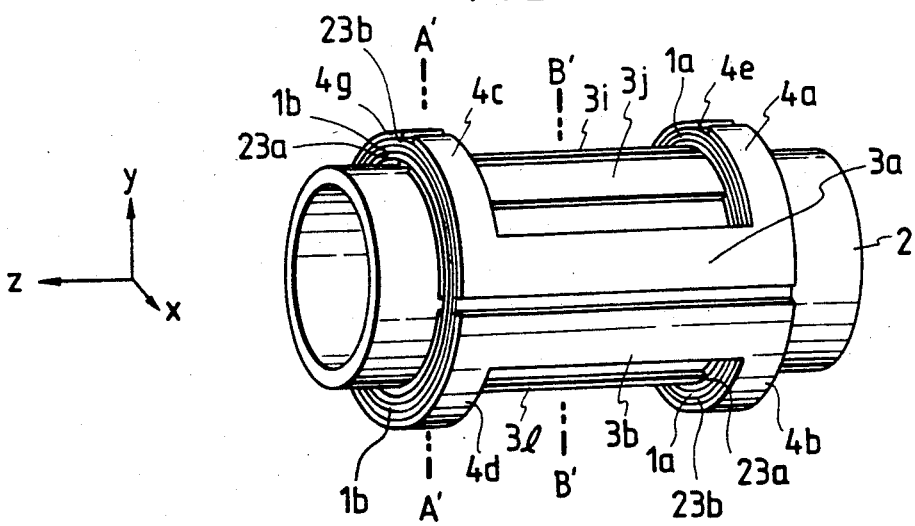
FIG. 11 is a bird's eye view showing still another example of a probe used in the NMR imaging apparatus of FIG. 1.
Figure 12A:
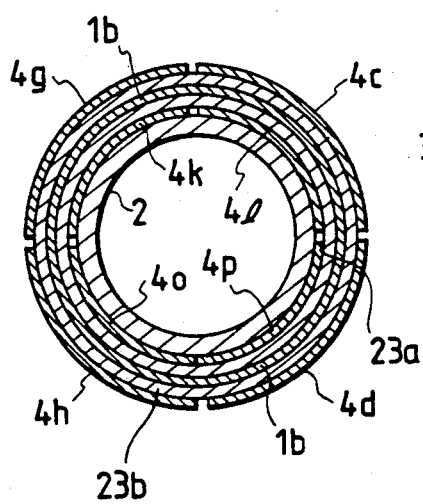
FIGS. 12(a) and 12(b) are sectional views on lines A'—A' and B'—B' of FIG. 10 respectively.
Figure 12B:
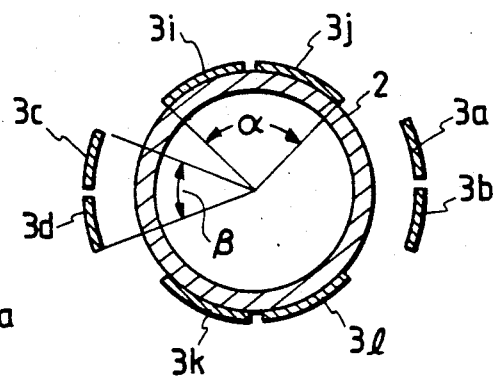
Figure 13:
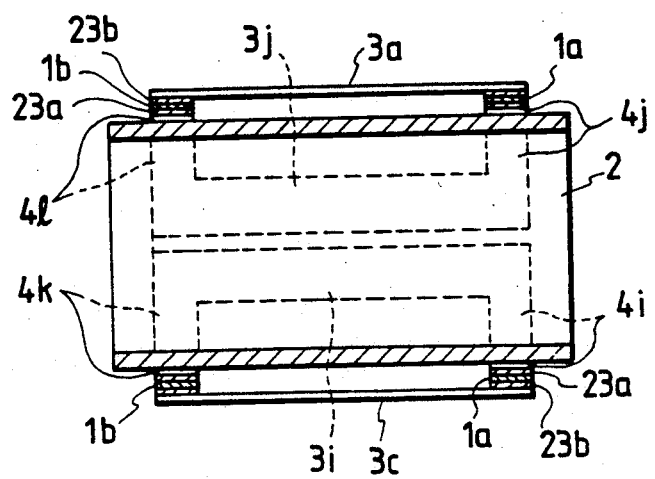
FIG. 13 is a sectional view of FIG. 11 cut along the xz plane.

FIG. 11 is a bird's eye view showing another embodiment of the invention, FIGS. 12(a) and 12(b) are sectional views on lines A'—A' and B'—B' of FIG. 11, and FIG. 13 is a sectional view of FIG. 11 cut along the xz plane, respectively. This embodiment is different from the hereinbefore described embodiments in that guard rings are used commonly by two probes. That is, a probe having sensitivity to the high-frequency magnetic field in the x direction comprises arms 3i-3l formed directly on a bobbin 2, wings 4i-4p extended from ends of these arms, and guard rings 1a and 1b composed of two endless ring-shaped conductors laminated on each wing through a dielectric layer 23a. A dielectric layer 23b is laminated further on these guard rings, and parts of wings 4a-4d are laminated on the dielectric layer 23b, thereby another probe having sensitivity to the high-frequency magnetic field in the y direction is formed.

In any of the embodiments, in order to obtain the uniform sensitivity when a human abdomen or breast is inserted, the arm angle $\alpha$ of the probe having sensitivity to the magnetic field in the x direction is made larger than the arm angle $\beta$ of the probe having sensitivity to the magnetic field in the y direction. For example, if the same arm angle is used and the former has the sensitivity being two times of that of the latter, the arm angle $\alpha$ is made about 60 degrees and the arm angle $\beta$ is made about 20 degrees, thereby lowering of the sensitivity is compensated and nearly uniform sensitivity distribution is obtained.

Figure 31:
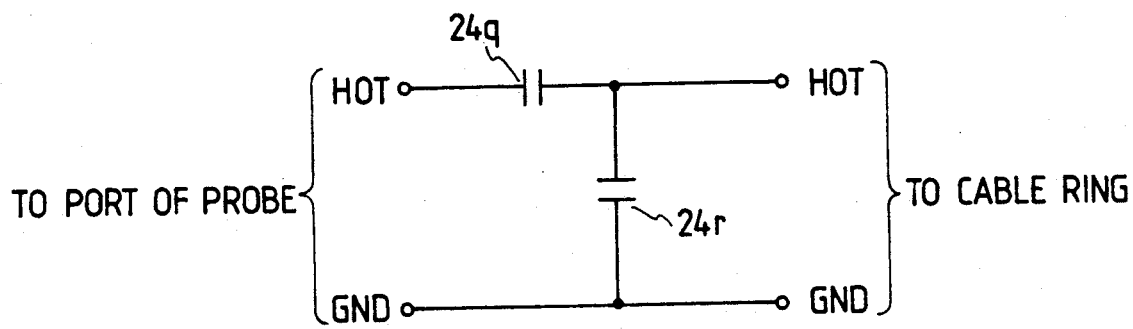
FIG. 31 is a circuit diagram showing a matching circuit used in the prior art and also in the invention.
Figure 32:
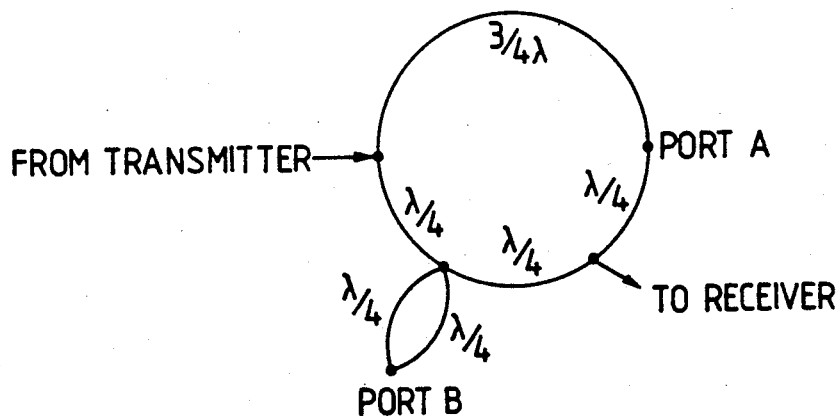
FIG. 32 is a circuit diagram showing a cable ring used in the prior art and also in the invention.

A matching circuit comprising capacitors 24q, 24r as shown in FIG. 31 is connected respectively to the port A and the port B of the above-mentioned RF probe, and further connected through a cable ring shown in FIG. 32 to a transmitter (transmitting amplifier 7 of FIG. 1) and a receiver (receiving amplifier 9 of FIG. 1). The cable ring comprises a coaxial cable with length corresponding to the delay quantity shown in the figure, and transmits the transmitting signals from the transmitter to both ports so that the port A is delayed from the port B in the phase by 90 degrees. Reversely, both receiving signals are added and transmitted to the receiver so that the receiving signal from the port A is advanced in the phase by 90 degrees with respect to the receiving signal from the port B.

In the hereinbefore described embodiments, the capacitive coupling between the top ends of the wings of the probes in the two perpendicular directions is constituted individually, thereby the resonant frequency can be adjusted independently in both probes. Also using the QD probe having constitution that wings of two probes are coupled in the capacitive coupling in sequence in ring shape, the shape of the arm portion or the signal transmission system is devised thereby nearly uniform sensitivity distribution can be obtained and the improvement of the SN ratio as the original object of the quadrature probes can be attained.

Figure 14:
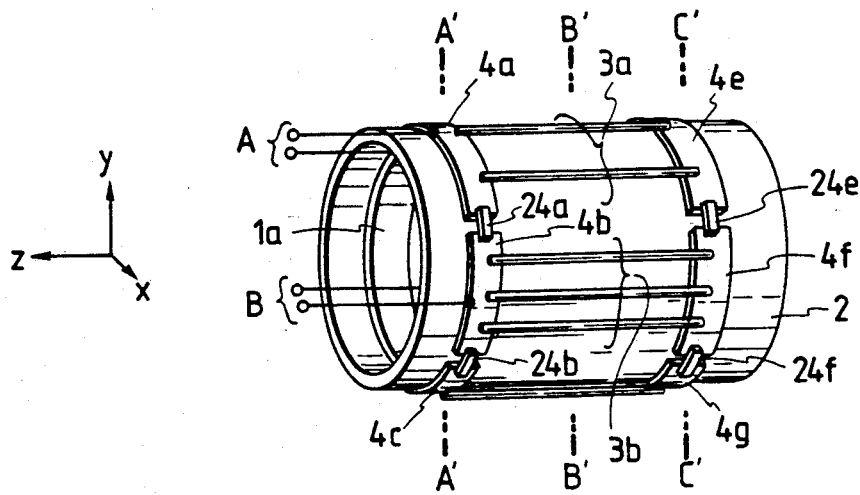
FIG. 14 is a bird's eye view showing still further example of a probe used in the NMR imaging apparatus of FIG. 1.
Figure 15A:
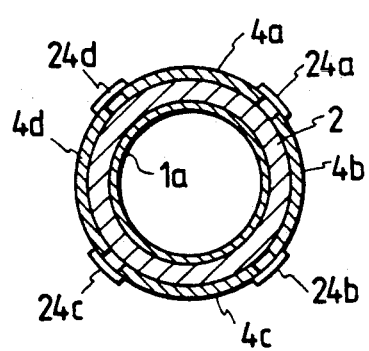
FIGS. 15(a), 15(b) and 15(c) are sectional views on lines A'—A', B'—B' and C'—C' of FIG. 14 respectively.
Figure 15B:
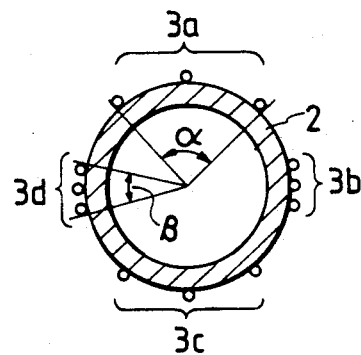
Figure 15C:
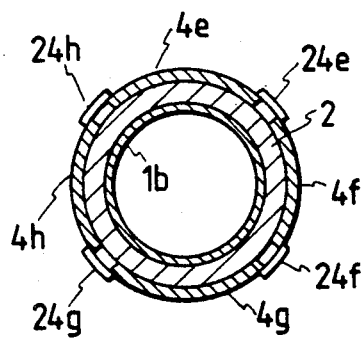
Figure 16:
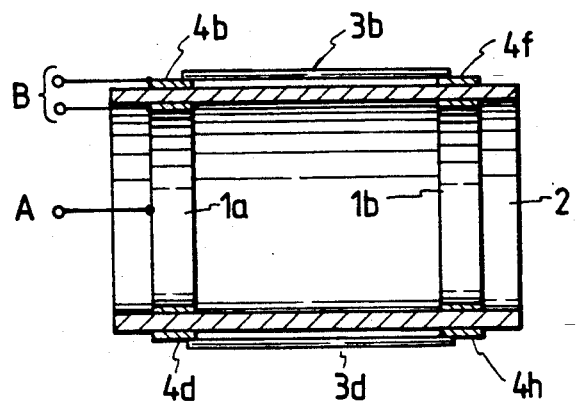
FIG. 16 is a sectional view of FIG. 14 cut along the xz plane.

One such example is shown in FIGS. 14 through 16. FIG. 14 is a bird's eye view, FIGS. 15(a), 15(b) and 15(c) are sectional views on lines A'—A', B'—B' and C'—C' of FIG. 14, and FIG. 16 is a sectional view of FIG. 14 cut along the xz plane, respectively. In this embodiment, each of a pair of conductor arms 3a and 3c and another pair of conductor arms 3b and 3d is composed of three conducting rods. Wings 4a, 4b, 4c, 4d connected to one end of respective arms are arranged in ring shape to the outside of a bobbin 2, and coupled in the capacitive coupling in sequence by capacitors 24a, 24b, 24c, 24d. A guard ring 1a is installed at the inside of the bobbin 2 corresponding to the position of these wings, and the wings are coupled with each other in the capacitive coupling also through the guard ring. Other ends of respective arms are connected to wings 4e, 4f, 4g, 4h, and these wings are also arranged in ring shape and coupled in the capacitive coupling in sequence by capacitors 24e, 24f, 24g, 24h and coupled in the capacitive coupling also through a guard ring 1b. The center position of the wing 4a and position of the guard ring 1a corresponding to the wing 4a are made the port A, and become a feeding point and a signal outputting point of a first probe circuit having sensitivity to the magnetic field in the x direction. Also the center position of the wing 4b and position of the guard ring 1b corresponding to the ring 4b are made the port B, and become a feeding point and a signal outputting point of a second probe circuit having sensitivity to the magnetic field in the y direction. In the embodiment, gap between conducting rods of the conductor arms 3a, 3c to constitute a current path of the first probe circuit is made wider than that between conducting rods of the conductor arms 3b, 3d to constitute a current path of the second probe circuit, thereby the arm angle $\alpha$ of the first probe circuit is made larger than the arm angle $\beta$ of the second probe circuit. In this case, if the number of the conducting rods to constitute the conductor arms is made equal and the arm angle is varied depending on the gap length, the sensitivity distribution can be adjusted by little variation of the inductance of the conductor arms, thereby the resonant frequency can be made coincident even if the first and second probe circuits are not made independent. If difference is produced in the resonant frequency, the capacitance ratio of the capacitors 24q, 24r of the matching circuit shown in FIG. 31 is made constant and the capacitance values are adjusted individually in the port A and the port B thereby the resonant frequency can be made coincident.

Figure 17:
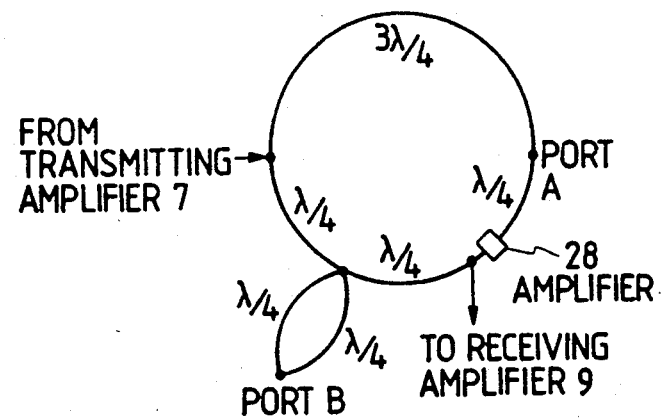
FIG. 17 is a circuit diagram showing an example of a cable ring used in the NMR imaging apparatus of FIG. 1.
Figure 18:
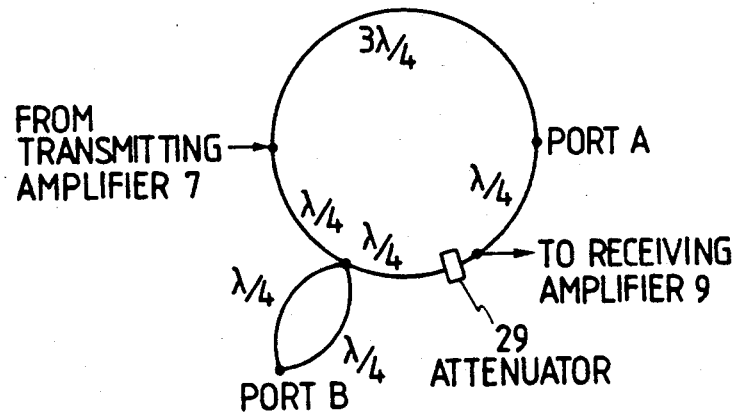
FIG. 18 is a circuit diagram showing another example of a cable ring used in the NMR imaging apparatus of FIG. 1.

In still another embodiment, an attenuator or an amplifier is inserted in a cable ring, thereby the intensity difference of signals from the two ports of the quadrature probes is corrected so that the sensitivity within the visual field is made uniform and the SN ratio is improved by the signal adding. FIG. 17 shows an example where at the midway of a coaxial cable from the port A of the cable ring to a receiving amplifier 9, another amplifier 28 is inserted. Also FIG. 18 shows an example where at the midway of a coaxial cable from the port B to a receiving amplifier 9, an attenuator 29 is inserted. Any of the examples may be combined with any QD probe in FIGS. 2 through 4, FIGS. 5 through 7, FIGS. 8 through 10, FIGS. 11 through 13, and FIGS. 14 through 16. It may be also combined with the QD probe of the prior art in FIGS. 28 through 30.

Amplification factor of the amplifier 28 in FIG. 17 or attenuation factor of the attenuator 29 in FIG. 18 is determined from the signal intensity Sa, Sb and the noise intensity Na, Nb in the port A and the port B of the QD probe as follows. When output of the port B is multiplied by $\alpha$ and combined, the composite signal S becomes S=Sa+$\alpha$Sb and the composite noise N becomes $$N = \sqrt{Na^2 + (aNb)^2} .$$

Consequently, the SN ratio after combination becomes Sa+

$$aSb/\sqrt{Na^2 + (aNb)^2} .$$

and if this is subjected to partial differentiation by $\alpha$ and value $\alpha$ in the maximum SN ratio is estimated, it follows that $$a = (Sb \times Nb^2)/(Sa \times Na^2)$$

This $\alpha$ is made attenuation factor of the attenuator. Amplification factor of the amplifier may be reciprocal of $\alpha$.

Figure 19:
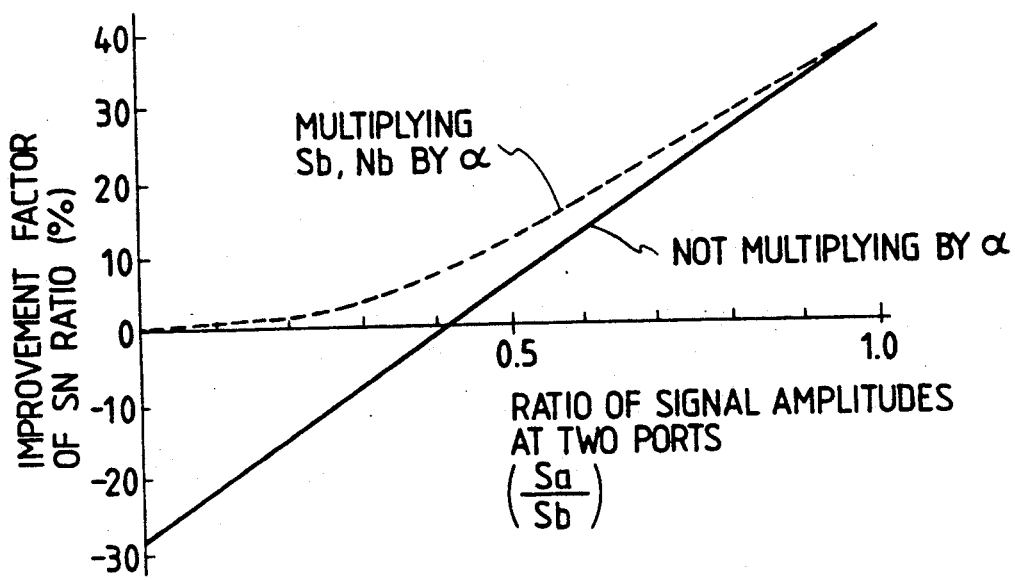
FIG. 19 is a graph illustrating effect of the circuits of FIG. 17 and FIG. 18.

FIG. 19 shows effect in FIG. 17 or FIG. 18. Abscissa represents ratio of signal amplitudes at the ports A, B, and solid line represents the SN ratio in combining without multiplying in spite of existence of the intensity difference expressed by improvement factor from the SN ratio in the receiving by single probe. On the other hand, broken line represents improvement factor of the SN ratio where is estimated as above described and amplification factor or attenuation factor is determined and signals corrected by constitution of FIG. 17 or FIG. 18 are combined. Thus the larger the difference of the intensity of the original signals, the larger the effect of improving the SN ratio by correcting the signal intensity.

Figure 20:
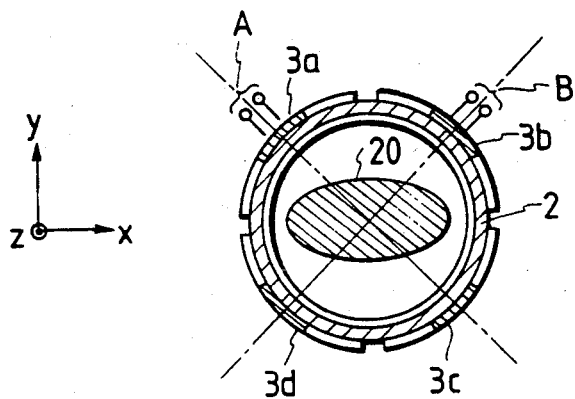
FIG. 20 is a sectional view showing another example of a probe used in the NMR imaging apparatus of FIG. 1.
Figure 21:
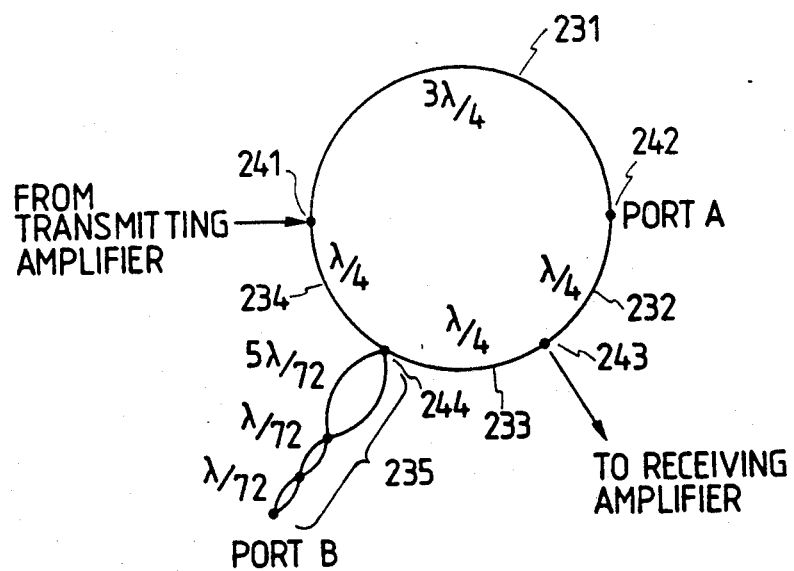
FIG. 21, FIG. 22 and FIG. 23 are circuit diagrams showing other examples of cable rings used in the NMR imaging apparatus of FIG. 1 respectively.
Figure 22:
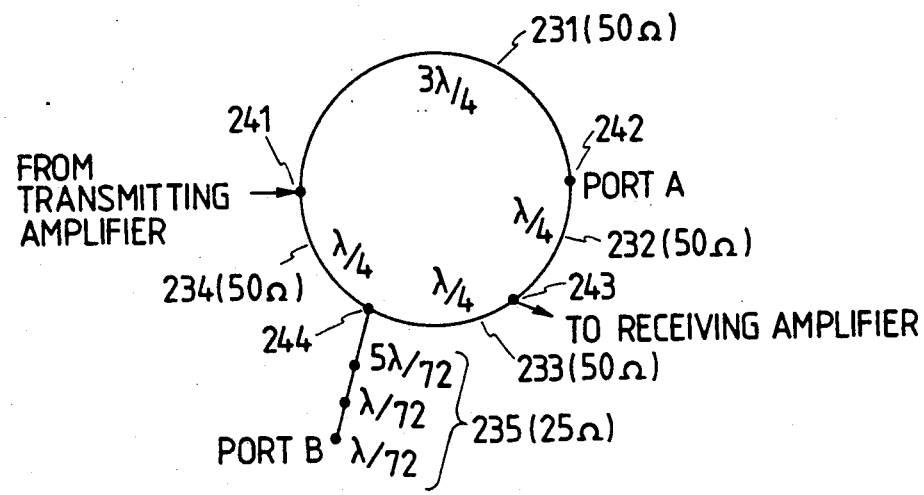
Figure 23:
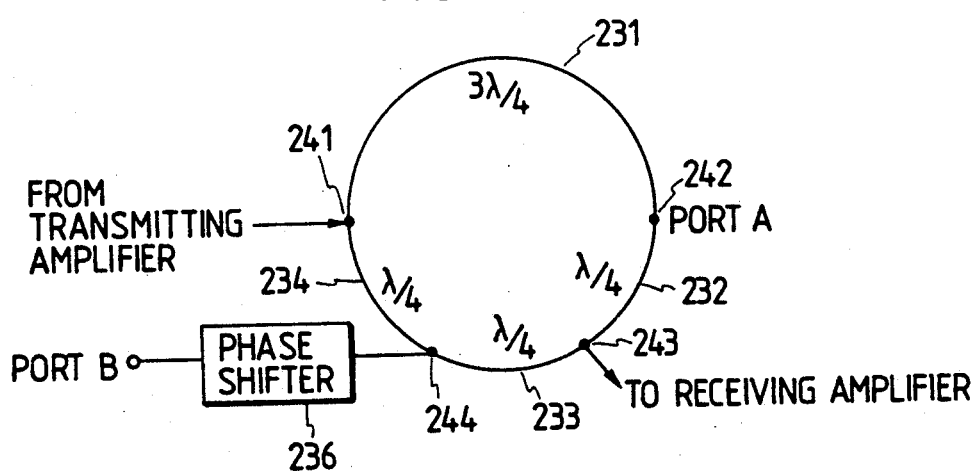
Figure 28:
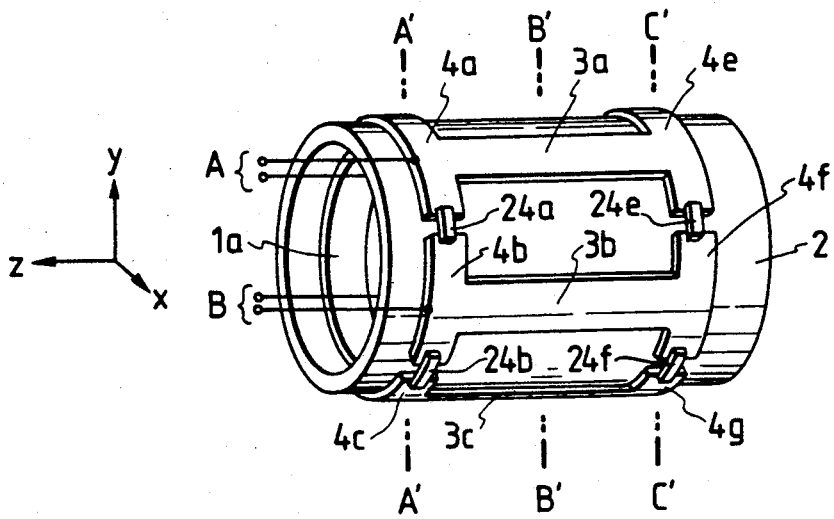
FIG. 28 is a bird's eye view showing a probe used in an NMR imaging apparatus in the prior art.
Figure 29A:
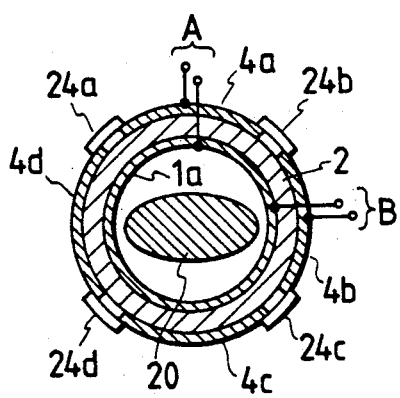
FIGS. 29(a), 29(b) and 29(c) are sectional views on lines A'—A', B'—B' and C'—C' of FIG. 28 respectively.
Figure 29B:
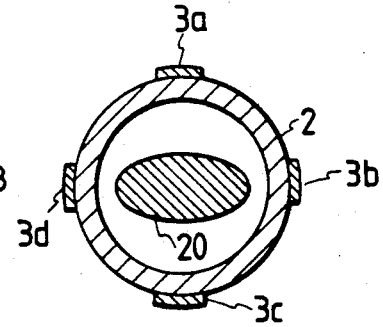
Figure 29C:
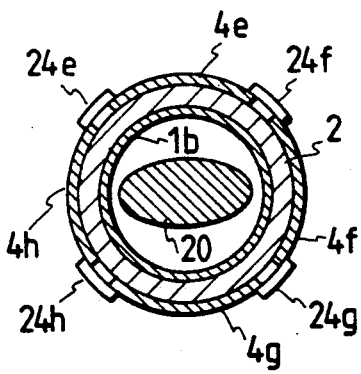
Figure 30:
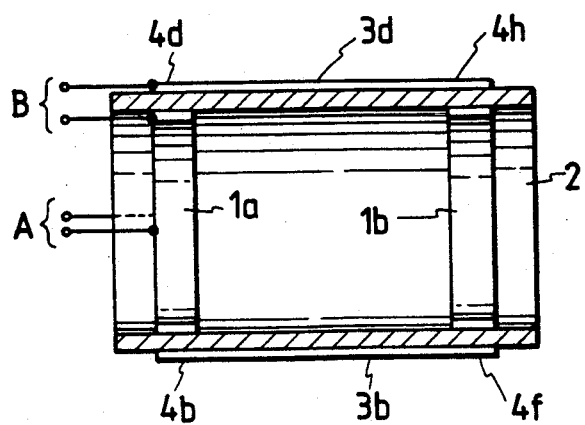
FIG. 30 is a sectional view of FIG. 28 cut along the xz plane.

FIG. 20 and FIG. 21 show still further embodiment. In any of the hereinbefore described embodiments, when an object to be inspected is inserted, a problem is in that the intensity difference of signals from the two ports is produced due to difference of loads applied to two coils of the Q probe, and solving of this problem is intended. On the other hand, in the embodiment shown in FIGS. 20 and 21, even if an object to be inspected having non-circular cross-section is intended, difference is not produced in the loads of the two coils. The constitution of the prior art shown in FIGS. 28 through 30 is used as constitution of this embodiment. However, the opposed direction of the first pair of arms 3a and 3c is inclined by 45 degrees with respect to the vertical direction, and also the opposed direction of the second pair of arms 3b and 3d is inclined by 45 degrees with respect to the vertical direction. Since the object 20 to be inspected is laid on its back and inserted within the probe and is inclined by 45 degrees obliquely viewing from any of the two pairs, difference of the loads viewing from the ports A, B is not produced. However, the phase difference of the ports A, B is shifted from 90 degrees due to the coupling of both pairs of arms and the object to be inspected. For example, the phase difference becomes about 30-40 degrees. Consequently, if the signal combining method of the QD probe in the prior art is adopted, the improvement of the SN ratio as the initial object of the QD probe cannot at all intended. Therefore, in place of the cable ring of FIG. 32, the cable ring of FIG. 21 is used and connection to the transmitting amplifier and the receiving amplifier is performed. In FIG. 21, coaxial cables 231, 232, 233, 234 have length corresponding to the delay quantity of $3\lambda/4$, $\lambda/4$, $\lambda/4$, $\lambda/4$ respectively, and are connected in ring shape. The transmitting amplifier is connected to a joint 241, the port A of the QD probe is connected to a joint 242, and the receiving amplifier is connected to a joint 243. The port B is connected to a joint 244 through a cable 235 with the delay quantity corresponding to the phase difference of signals from the port A and the port B. However, since the phase difference of signals is varied depending on shape and size of the object to be inspected, in the embodiment, a plurality of cables with length of λ/72 is installed and the suitable number of cables are connected in series to the cable with length of 5λ/75, thereby arbitrary delay quantity is realized from 25 degrees at step of five degrees. When cables having equal characteristic impedance are used in all coaxial cables, the two coaxial cables must be used in parallel in the connection between the joint 244 and the port B. Consequently, as shown in FIG. 22, if cables with characteristic impedance 50 are used in the cables 231-234 and a cable with characteristic impedance 25 is used in the cable 235, the connection becomes more easy. Also as shown in FIG. 23, a phase shifter 236 with the shift amount adjustable may be used in place of the cable 235.

In all embodiments as hereinbefore described, although the RF probe is used both for generation of the high-frequency magnetic field and for detection of the high-frequency magnetic field, the generation of the high-frequency magnetic field may be performed by a separate high-frequency coil.

Figure 24:
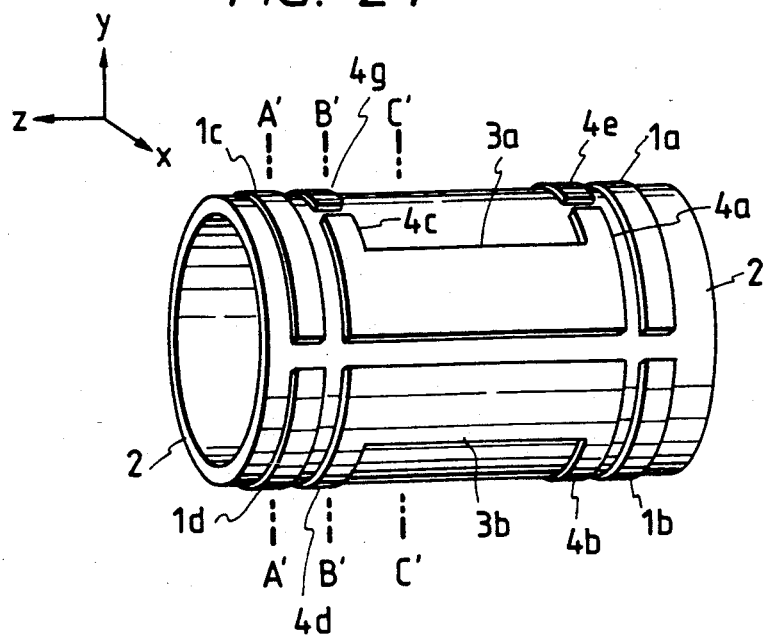
FIG. 24 is a bird's eye view showing further example of a probe used in the NMR imaging apparatus of FIG. 1.
Figures 25A, 25B, 25C:
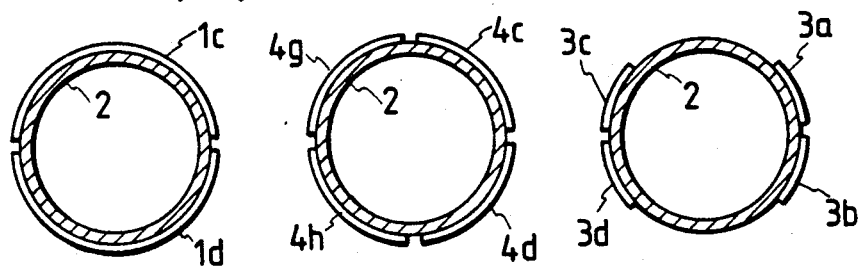
FIGS. 25(a), 25(b) and 25(c) are sectional views on lines A'—A', B'—B' and C'—C' of FIG. 24 respectively.
Figure 26:
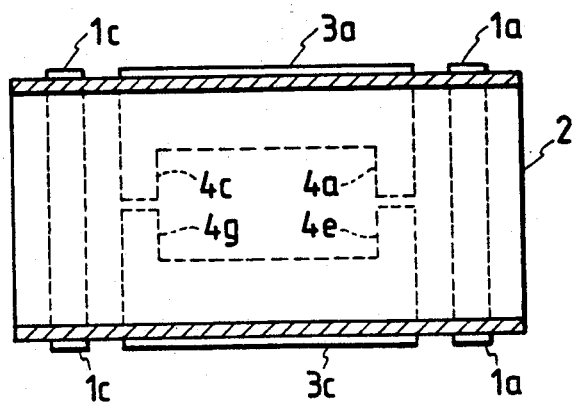
FIG. 26 is a sectional view of FIG. 24 cut along the xz plane.

FIG. 24 is a bird's eye view showing further embodiment of the invention, FIGS. 25(a), (b) and (c) are sectional views on lines A'—A', B'—B' and C'—C' of FIG. 24, and FIG. 26 is a sectional view of FIG. 24 cut along the xz plane, respectively. In this embodiment, all electrodes to constitute a first probe or a second probe, for example, wings 4a-4h, arms 3a-3d, guard rings 1a-1d, are formed on a cylindrical surface at the outside of a bobbin 2. In this constitution, the outer diameter of the probe may be made smaller than that of the probe in the prior art, and the resonant frequency can be easily adjusted by moving the guard ring in the z axis direction. Further in this constitution, since the capacitance due to opposition of the wing and the guard ring is small, the resonant frequency can be made high.

Figure 27A:
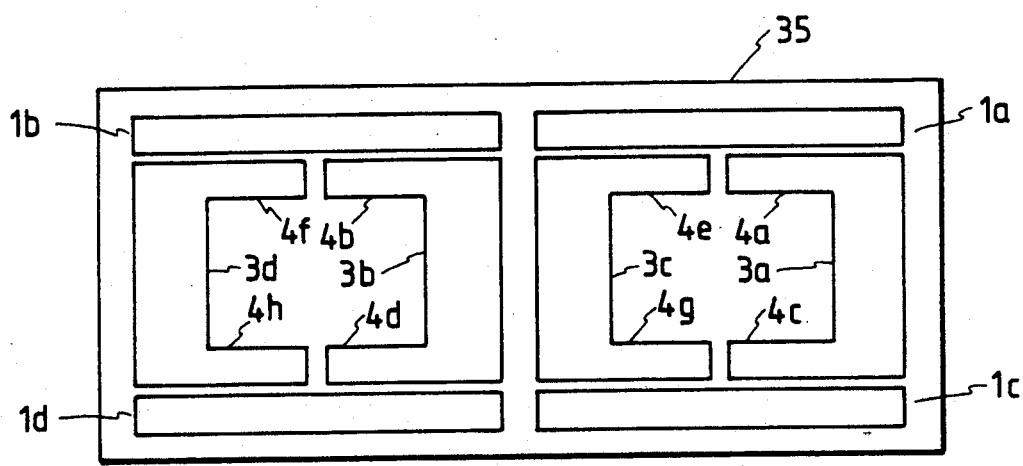
FIG. 27(a) is a diagram showing a constitution example of an electrode in the probe of FIG. 24.
Figure 27B:
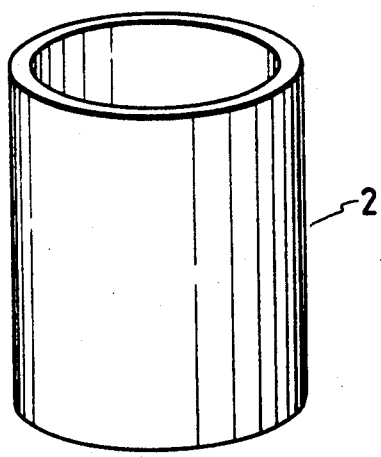
FIG. 27(b) is a diagram showing a constitution example of a bobbin in the probe of FIG. 24.

In FIG. 27(a), each electrode part is formed on one thin film material 35. If this is only wound to a cylindrical bobbin 2 shown in FIG. 27(b), that having the same constitution as FIG. 24 can be formed. As effects by making the electrode in film shape, since the machining accuracy is significantly improved (such as, dimension of the electrode), the reproducibility is obtained in property of the probe and the assembling time can be reduced. When a soft material such as teflon is used in an insulator corresponding to the bobbin 2 of FIG. 27(b), one sheet-shaped insulator with electrodes is wound to a human body, thereby a cylindrical probe can be formed and the filling factor can be improved. Although one thin film material is formed in the figure, plural sheets of the thin film material may be formed. For example, only the guard ring part is formed by a separate thin film material, thereby the position of the guard ring can be varied freely and the resonant frequency can be easily adjusted.

In the QD probe shown in FIGS. 2 through 4, since the first probe and the second probe being different in diameter are mutually combined, the outer diameter of the QD probe is liable to become large in comparison to the inner diameter. Consequently, if both or any one of the first probe and the second probe in the QD probe shown in FIGS. 2 through 4 are formed in the structure shown in FIGS. 24 through 26 or in the structure shown in FIGS. 27(a) and 27(b), the compact QD probe can be obtained.

We claim:

1. A nuclear magnetic resonance imaging apparatus wherein a magnetic field along a first direction is formed in a prescribed space, and nuclear spins of an object to be inspected, which is disposed within said space, are excited by a high-frequency magnetic field, and a high-frequency signal induced by the nuclear spins is detected, said nuclear magnetic resonance imaging apparatus comprising:

an RF probe which is installed within said space and into which the object to be inspected is inserted, said RF probe including a first probe circuit and a second probe circuit, said first probe circuit being formed of a first pair of conductor arms extending along the first direction and arranged so as to be spaced from each other and symmetrically to each other with respect to a first plane passing through a center axis along the first direction, the first pair of conductor arms being capacitively coupled with each other at both ends thereof, said second probe circuit being formed of a second pair of conductor arms extending along the first direction and arranged to be spaced from each other and symmetrically to each other with respect to a second plane crossing perpendicularly to the first plane at the center axis, the second pair of conductor arms being capacitively coupled with each other at both ends thereof, an angle from the center axis covering a width of each of the conductor arms of the first pair of conductor arms being different from an angle from the center axis covering a width of each of the conductor arms of the second pair of conductor arms; and receiving means for receiving and combining high-frequency signals detected in said first and second probe circuits.

2. A nuclear magnetic resonance imaging apparatus according to claim 1, wherein wings laterally extend from both ends of respective conductor arms in the first pair and the second pair of conductor arms and are coupled by individual capacitors, respectively.

3. A nuclear magnetic resonance imaging apparatus according to claim 2, wherein a first set of guard rings is installed in the vicinity of respective wings extended from both ends of respective conductor arms in the first pair of conductor arms, and a second set of guard rings is installed in the vicinity of respective wings extended from both ends of respective conductor arms in the second pair of conductor arms.

4. A nuclear magnetic resonance imaging apparatus according to claim 2, wherein one set of guard rings is installed in the vicinity of the wings extended from both ends of respective conductor arms in the first pair of conductor arms and the wings extended from both ends of respective conductor arms in the second pair of conductor arms.

5. A nuclear magnetic resonance imaging apparatus according to claim 1, wherein each conductor arm in the first pair of conductor arms and each conductor arm in the second pair of conductor arms comprise a plurality of conducting rods, respectively, the conducting rods constituting each conductor arm in the first pair of conductor arms being spaced from one another by a first gap and the conducting rods constituting each conductor arm in the second pair of conductor arms being spaced apart from one another by a second gap having a length different from the first gap.

6. A nuclear magnetic resonance imaging apparatus according to claim 5, wherein the number of conducting arms constituting each conductor arm in the first pair of conductor arms and the number of conducting rods constituting each conductor arm in the second pair of conductor arms are equal.

7. A nuclear magnetic resonance imaging apparatus wherein a magnetic field along a first direction is formed in a prescribed space, and nuclear spins of an object to be inspected, which is disposed within said space, are excited by a high-frequency magnetic field, and a high-frequency signal induced by the nuclear spins is detected, said nuclear magnetic resonance imaging apparatus comprising:
   an RF probe which is installed within said space and into which the object to be inspected is inserted, said RF probe including a first probe circuit and a second probe circuit, said first probe circuit being formed of a first pair of conductor arms extending along the first direction and arranged so as to be spaced from each other and symmetrically to each other with respect to a horizontal plane passing through a center axis along the first direction, the first pair of conductor arms being capacitively coupled to each other at both ends thereof, said second probe circuit being formed of a second pair of conductor arms extending along the first direction and arranged so as to be spaced from each other and symmetrically to each other with respect to a vertical plane crossing perpendicularly to the horizontal plane at the center axis, the second pair of conductor arms being capacitively coupled to each other at both ends thereof, an angle from the center axis covering a width of each of the conductor arms of the first pair of conductor arms being larger than an angle from the center axis covering the width of each of the conductor arms of the second pair of conductor arms; and
   receiving means for receiving and combining high-frequency signals detected in the first and second probe circuits.

8. A nuclear magnetic imaging apparatus wherein a magnetic field along a first direction is formed in a prescribed space, and nuclear spins of an object to be inspected, which is disposed within said space, are excited by a high-frequency magnetic field, and a high-frequency signal induced by the nuclear spins is detected, said nuclear magnetic resonance imaging apparatus comprising:
   means forming first and second RF probes, said first RF probe being formed on a first cylindrical surface and having a first pair of conductor arms extending along the first direction and arranged so as to be symmetrical to each other with respect to a first plane passing through a center axis of the first cylindrical surface, the first pair of conductor arms being capacitively coupled with each other at both ends thereof, said second RF probe being formed on a second cylindrical surface positioned inwardly and coaxial with the first cylindrical surface, said second RF probe having a second pair of conductor arms extending along the first direction and arranged so as to be symmetrical to each other with respect to a second plane crossing perpendicularly to the first plane at the center axis of the first and second cylindrical surfaces, the second pair of conductor arms being capacitively coupled with each other at both ends thereof, an angle from the center axis covering the width of each of the conductor arms in the second pair of conductor arms being larger than an angle from the center axis covering the width of each of the conductor arms in the first pair of conductor arms; and
   receiving means for receiving and combining high-frequency signals detected in said first and second RF probes.

9. A nuclear magnetic resonance imaging apparatus wherein a magnetic field along a first direction is formed in a prescribed space, and nuclear spins of an object to be inspected, which is disposed within said space, are excited by a high-frequency magnetic field, and a high-frequency signal induced by the nuclear spins is detected, said nuclear magnetic resonance imaging apparatus comprising:
   an RF probe which is installed within said space and into which the object to be inspected is inserted, said RF probe including first and second probe circuits, said first probe circuit being formed by a first pair of conductor arms extending along said first direction and arranged so as to be spaced from each other and symmetrically to each other with respect to a first plane passing through a center axis along the first direction, the first pair of conductor arms being capacitively coupled with each other at both ends thereof, said second probe circuit being formed by a second pair of conductor arms extending along the first direction and arranged so as to be spaced from each other and symmetrically to each other with respect to a second plane crossing perpendicularly to the first plane at the center axis, the second pair of conductor arms being capacitively coupled with each other at both ends thereof;
   signal combining means for compensating differences in intensity and phase between outputs of said first and second probe circuits and for combining the compensated outputs into a high-frequency signal; and
   receiving means for receiving the high-frequency signal from said signal combining means.

10. A nuclear magnetic resonance imaging apparatus according to claim 9, wherein said signal combining means includes an amplifier inserted in one of signal lines from said first and second probe circuits coupled to said receiving means.

11. A nuclear magnetic resonance imaging apparatus according to claim 9, wherein said signal combining means includes an attenuator inserted in one of signal lines from said first and second probe circuits coupled to said receiving means.

12. A nuclear magnetic resonance imaging apparatus, wherein a magnetic field along a first direction is formed in a prescribed space, and nuclear spins of an object to be inspected, which is disposed within said space, are excited by a high-frequency magnetic field and a high-frequency signal induced by the nuclear spins is detected, said nuclear magnetic resonance imaging apparatus comprising:
   an RF probe which is installed within said space and into which the object to be inspected is inserted, said RF probe including first and second probe circuits, said first probe circuit being formed by a first pair of conductor arms extending along the first direction arranged so as to be spaced from each other and symmetrically to each other with respect to a first plane passing through a center axis along the first direction, said first pair of conductor arms being capacitively coupled with each other at both ends thereof, said second probe circuit being formed by a second pair of conductor arms extending along the first direction and arranged so as to be spaced from each other and symmetrically to each other with respect to a second plane crossing perpendicularly to the first plane at the center axis, the second pair of conductor arms being capacitively coupled with each other at both ends thereof;

receiving means for receiving a high frequency signal detected by said RF probe; and signal transmission network means for combining and transmitting outputs of said first and second probe circuits to said receiving mean, said signal transmission network means including a phase shifter for providing a relative delay of phase other than 90° on one of the outputs of said first and second probe circuits before combining of the outputs of said first and second probe circuits.

13. A nuclear magnetic resonance imaging apparatus according to claim 12, wherein said RF probe is installed in such a direction that the first and second planes are inclined about 45° with respect to a vertical direction so that when an oval object to be inspected is inserted, a phase difference of detection signals from said first and second probe circuits is shifted from 90°.

14. A nuclear magnetic resonance imaging apparatus according to claim 12, wherein said phase shifter includes a plurality of phase delay cables connectable in series.

* * * * *